United States Patent
Elmquist (10) Patent No.: US 10,819,320 B2
(45) Date of Patent: Oct. 27, 2020

(54) ARRANGEMENT COMPRISING AN ELECTRICAL PULSE GENERATING MODULE

(71) Applicant: ScandiNova Systems AB, Uppsala (SE)

(72) Inventor: Klas Elmquist, Uppsala (SE)

(73) Assignee: ScandiNova Systems AB (SE)

( * ) Notice: Subject to any disclaimer, the term of this patent is extended or adjusted under 35 U.S.C. 154(b) by 0 days.

(21) Appl. No.: 16/474,948

(22) PCT Filed: Dec. 19, 2017

(86) PCT No.: PCT/EP2017/083529
§ 371 (c)(1),
(2) Date: Jun. 28, 2019

(87) PCT Pub. No.: WO2018/122038
PCT Pub. Date: Jul. 5, 2018

(65) Prior Publication Data
US 2019/0348973 A1   Nov. 14, 2019

(30) Foreign Application Priority Data
Dec. 29, 2016   (EP) .................................... 16207286

(51) Int. Cl.
*H03K 3/57* (2006.01)
*H02H 9/00* (2006.01)
(52) U.S. Cl.
CPC ............... *H03K 3/57* (2013.01); *H02H 9/002* (2013.01)
(58) Field of Classification Search
CPC ........... H03K 3/57; H02H 9/002; H02M 1/40; H02M 3/335; H02M 1/32
See application file for complete search history.

(56) References Cited

U.S. PATENT DOCUMENTS

| | | | |
|---|---|---|---|
| 6,172,383 B1* | 1/2001 | Williams | H02M 1/32 257/173 |
| 6,529,387 B2* | 3/2003 | Kirbie | H02M 3/33569 363/16 |
| 2002/0186577 A1* | 12/2002 | Kirbie | H05H 7/02 363/131 |

FOREIGN PATENT DOCUMENTS

| | | |
|---|---|---|
| CN | 203504453 U | 3/2014 |
| CN | 103795286 A | 5/2014 |

(Continued)

*Primary Examiner* — Jared Fureman
*Assistant Examiner* — Michael J Warmflash
(74) *Attorney, Agent, or Firm* — Condo Roccia Koptiw LLP (57) ABSTRACT

An arrangement (100) is disclosed, comprising an electrical pulse generating module (10) configured to generate at least one electrical pulse, and a transformer (20) electrically connected to the electrical pulse generating module (10). The electrical pulse generating module (10) comprises an electrical energy storage module (40) that can be charged or discharged, and a switch unit (50) controllably switchable between at least a conducting state and a non-conducting state. When the switch unit (50) is switched into the non-conducting state, a power supply (30) charges the electrical energy storage module (40) by way of a charging current. When the switch unit (50) is switched into the conducting state, the electrical energy storage module (40) is discharged to create an electrical pulse to be received by the transformer (20). The electrical pulse generating module (10) comprises a flyback protection unit (60) configured to protect the switch unit (50) against flyback upon the switch unit (50) being switched into the non-conducting state. The flyback protection unit (60) forms a current path (65) that bypasses the transformer (20), and is configured such that a relation between the voltage drop across the flyback protection unit (60) for the charging current and the voltage drop across the (Continued)

transformer (20) for the charging current is such so as to cause the charging current to be directed via the transformer (20) at least to some extent.

8 Claims, 3 Drawing Sheets

(56) References Cited

FOREIGN PATENT DOCUMENTS

| | | |
|---|---|---|
| CN | 104734555 A | 6/2015 |
| CN | 204886687 U | 12/2015 |
| DE | 102010002231 A1 | 8/2011 |
| JP | 2005-295654 A | 10/2005 |
| WO | 2012/153764 A1 | 11/2012 |

\* cited by examiner

ARRANGEMENT COMPRISING AN ELECTRICAL PULSE GENERATING MODULE

CROSS REFERENCE TO RELATED APPLICATIONS

This application is the National Stage Entry under 35 U.S.C. § 371 of Patent Cooperation Treaty Application No. PCT/EP2017/083529, filed Dec. 19, 2017, which claims the priority of European Patent Application No. 16207286.2, filed Dec. 29, 2016, the contents of which are hereby incorporated by reference herein.

TECHNICAL FIELD

The present invention generally relates to the field of electrical systems. Specifically, the present invention relates to an arrangement comprising an electrical pulse generating module configured to generate at least one electrical pulse.

BACKGROUND

Electrical pulses may be employed in a variety of applications, such as, for example, radar systems, particle accelerators, sterilization equipment, high-energy lasers, microwave systems, or medical devices. In such and other applications it may be desired or required to deliver a one or more electrical pulses to a load. Systems or circuits which are employed for generating electrical pulses may be referred to as power modulators. Power modulators may employ a pulse transformer in order to obtain the required or desired energy of the electrical pulses. In some applications it may be desired or even required with a capability of providing electrical pulses to the pulse transformer which have a relatively high power and/or a relatively high frequency.

SUMMARY

An electrical pulse generating module in a power modulator may employ a power supply and an electrical energy storage module that can be charged or discharged. The electrical energy storage module may for example comprise a capacitor or several capacitors (e.g., a capacitor bank). Electrical pulses may be generated by repeatedly or cyclically performing charging and discharging of the electrical energy storage module, wherein when the electrical energy storage module is discharged, an electrical pulse is generated which may be received by a transformer (e.g., a voltage step-up transformer) connected to a load. Possibly, the electrical pulse may be delivered or conveyed directly to the load.

In order to carry out the repeated charging and discharging of the electrical energy storage module, a switch or switching device may be included in the electrical pulse generating module, which may selectively electrically connect or disconnect a power supply with the electrical energy storage module. When the electrical energy storage module has been discharged so as to generate an electrical pulse and the electrical pulse has been terminated, the electrical energy storage module should be charged again in preparation for the next electrical pulse, upon which the switch or switching device may be switched into an open, or non-conducting state. Due to the sudden disappearance of current when an electrical pulse is terminated, flyback may possibly occur in the electrical pulse generating module. Such flyback may damage or even destroy, e.g., the switch or switching device due to the generally high voltage of the electrical pulses which are generated. To this end, a flyback protection unit may electrically connected to the switch or switching device for protection thereof against flyback upon the switch or switching device being opened.

Between electrical pulses—e.g., after an electrical pulse has been terminated and during the charging of the electrical energy storage module in preparation for starting delivery of the next electrical pulse to the transformer—the transformer core should preferably be reset to its proper magnetic operating point, for example by removing all, or substantially all, energy from the transformer core. Alternatively, the transformer core may not be demagnetized when the next electrical pulse begins, but may for example be reset to a magnetic operating point in which the core is magnetized so as to exhibit a negative magnetic field strength. For example, provided the magnetic field strength of the transformer core can vary between $-B_1$ and $B_1$, where $B_1 > 0$, the transformer core may be reset (or 'biased') prior to the next electrical pulse begins so that it has a magnetic field strength $-B_1$. The 'available' operating range of the transformer before saturation of the transformer core possibly may occur could then hence be $2B_1$. By resetting the transformer core after each electrical pulse that has been delivered to the transformer, the full—or a substantially full—operating range of the transformer may be available for the next electrical pulse that is received by the transformer. To this end, a transformer reset power supply may be employed for supplying a current to the transformer for resetting the transformer core after an electrical pulse has been terminated and prior to the next electrical pulse. It has been found by the inventor that a charging current (which, e.g., may be provided by a power supply included in the electrical pulse generating module) present in the electrical pulse generating module during the charging of the electrical energy storage module may be directed, or conveyed, via the transformer, and may in so doing contribute to the resetting of the transformer core (i.e., in addition to the resetting of the transformer core carried out by means of the transformer reset power supply). It has further been found by the inventor that by employing the charging current to so that it makes a contribution to the resetting of the transformer core, it may be possible to provide the transformer with electrical pulses which have a relatively high frequency.

In view of the above, a concern of the present invention is to provide an arrangement comprising an electrical pulse generating module configured to generate at least one electrical pulse and a transformer for receiving the at least one electrical pulse generated by the at least one electrical pulse generating module, which electrical pulse generating module may facilitate or allow for providing electrical pulses to the transformer which have a relatively high frequency.

To address at least one of this concern and other concerns, an arrangement in accordance with the independent claim is provided. Preferred embodiments are defined by the dependent claims.

According to a first aspect there is provided an arrangement comprising an electrical pulse generating module configured to generate at least one electrical pulse, and a transformer electrically connected to the electrical pulse generating module and configured to receive the at least one electrical pulse generated by the at least one electrical pulse generating module. The electrical pulse generating module comprises a power supply and an electrical energy storage module that can be charged or discharged. The electrical energy storage module is electrically connected to the transformer. The electrical pulse generating module comprises a switch unit that is controllably switchable between at least a conducting state and a non-conducting state. The switch unit is electrically connected to the power supply and the electrical energy storage module, respectively, such that when the switch unit is switched into the non-conducting state, the power supply charges the electrical energy storage module (partially or completely) by way of a charging current supplied by the power supply, and when the switch unit is switched into the conducting state, the electrical energy storage module is discharged (partially or completely) so as to create an electrical pulse to be received by the transformer. The arrangement comprises a flyback protection unit electrically connected to the switch unit and configured to protect the switch unit against flyback upon the switch unit being switched into the non-conducting state. The flyback protection unit forms a current path that bypasses the transformer. The flyback protection unit is configured such that a relation between the voltage drop across the flyback protection unit for the charging current and the voltage drop across the transformer for the charging current is such so as to cause the charging current to be directed (or conveyed, or routed) via the transformer at least to some extent.

According to a second aspect there is provided an arrangement comprising an electrical pulse generating module configured to generate at least one electrical pulse, and a transformer electrically connected to the electrical pulse generating module and configured to receive the at least one electrical pulse generated by the at least one electrical pulse generating module. The electrical pulse generating module comprises a power supply and an electrical energy storage module that can be charged or discharged. The electrical energy storage module is electrically connected to the transformer. The electrical pulse generating module comprises a switch unit that is controllably switchable between at least a conducting state and a non-conducting state. The switch unit is electrically connected to the power supply and the electrical energy storage module, respectively, such that the power supply charges the electrical energy storage module (partially or completely) by way of a charging current supplied by the power supply, or the electrical energy storage module is discharged (partially or completely) so as to create an electrical pulse to be received by the transformer, based on switching of the at least one switch unit between at least the conducting state and the non-conducting state thereof. For example, as per the first aspect described in the foregoing, the switch unit may be electrically connected to the power supply and the electrical energy storage module, respectively, such that when the switch unit is switched into the non-conducting state, the power supply charges the electrical energy storage module by way of a charging current supplied by the power supply, and when the switch unit is switched into the conducting state, the electrical energy storage module is discharged so as to create an electrical pulse to be received by the transformer. The arrangement comprises a flyback protection unit electrically connected to the switch unit and configured to protect the switch unit against flyback upon the switch unit being switched into the non-conducting state. The flyback protection unit forms a current path that bypasses the transformer. The flyback protection unit is configured such that a relation between the voltage drop across the flyback protection unit for the charging current and the voltage drop across the transformer for the charging current is such so as to cause the charging current to be directed (or conveyed, or routed) via the transformer at least to some extent.

By the charging current being directed via the transformer at least to some extent, at least a part or portion of the charging current may be directed via the transformer. For example, by configuring the flyback protection unit such that the voltage drop across the flyback protection unit for the charging current has a selected value relatively to a value of the voltage drop across the transformer for the charging current, at least a part or portion of the charging current may be directed via the transformer.

As indicated in the foregoing, the flyback protection unit forms a current path in the electrical pulse generating module, which current path bypasses the transformer (for example, so that current in the electrical pulse generating module may not be directed via, or pass, the transformer when going through the current path formed by the flyback protection unit). The flyback protection unit forms a current path by which current may bypass the transformer when the power supply charges the electrical energy storage module. However, by configuring the flyback protection unit such that a relation between the voltage drop across the flyback protection unit for the charging current and the voltage drop across the transformer (or voltage, e.g., a voltage over at least one (primary) winding of the transformer) for the charging current is such so as to cause the charging current to be directed via the transformer at least to some extent, at least a part or portion of the charging current may be caused to be directed via the transformer, and not only via the current path formed by the flyback protection unit. By at least a part or portion of the charging current being directed via the transformer, the charging current may contribute to the resetting of a core of the transformer. The voltage drop across the flyback protection unit for the charging current may determine the voltage over the transformer (e.g., the voltage over at least one (primary) winding of the transformer), which in turn may govern the extent to which the part or portion of the charging current that is directed via the transformer contributes to the resetting of the core. As indicated in the foregoing, it has been found by the inventor that by employing the charging current to so that it makes a contribution to the resetting of the core of the transformer, it may be facilitated or even enabled to provide the transformer with electrical pulses which have a relatively high frequency. Thus, the electrical pulse generating module of the arrangement may facilitate or allow for providing electrical pulses to the transformer which have a relatively high frequency. Depending on the voltage drop across the transformer for the charging current, the flyback protection unit may have to be configured so as to exhibit a larger voltage drop across the flyback protection unit (for the charging current) than what might be sufficient for achieving a sufficient flyback protection functionality or capacity for the switch unit.

Furthermore, by employing the charging current to so that it makes a contribution to the resetting of the core of the transformer, any transformer reset power supply, which may be employed for supplying a current to the transformer for resetting the core of the transformer, might be required to have a smaller capacity with regard to, e.g., magnitude of its output current, as compared to if the charging current would not be employed to make it contribute to the resetting of the core of the transformer.

The flyback protection unit may possibly be configured such that the voltage drop across the flyback protection unit for the charging current may be larger than the voltage drop across the transformer for the charging current. Also, the charging current could possibly be directed via the transformer to a greater extent than via the current path formed by the flyback protection unit.

Possibly, the flyback protection unit may be configured such that a relation between the voltage drop across the flyback protection unit for the charging current and the voltage drop across the transformer for the charging current is such so as to cause the charging current to be directed via the transformer, but not (or substantially not) via the current path formed by the flyback protection unit. Thus, the charging current may possibly be caused to altogether avoid the current path formed by the flyback protection unit. However, a very small part or portion of the charging current could possibly still be directed via the current path formed by the flyback protection unit.

The electrical energy storage module may for example comprise at least one capacitor. Possibly, the electrical energy storage module may comprise several capacitors, e.g., a capacitor bank.

The transformer may be electrically connected to the electrical pulse generating module for example by way of at least one winding of the transformer being electrically connected to the electrical pulse generating module. The at least one winding of the transformer may be configured to receive the at least one electrical pulse generated by the at least one electrical pulse generating module. The charging current may be directed via the transformer by means of the charging current being conveyed through the at least one winding of the transformer.

The switch unit may for example comprise one or more solid-state semiconductor switching devices with turn-on and turn-off capability, such as, for example, at least one Integrated Gate-Commutated Transistor (IGCT), metal oxide semiconductor field effect transistor (MOSFET), gate turn-off thyristor (GTO) and/or Insulated-Gate Bipolar Transistor (IGBT), but is not limited thereto.

The power supply of the electrical pulse generating module may comprise a power converter. For example, the power supply of the electrical pulse generating module may comprise or be connectable to an Alternating Current (AC) source, and may further comprise a rectifier for converting AC from the AC source into Direct Current (DC) which can be used to charge the electrical energy storage module.

In the context of the present application, by a non-conducting state of the switch unit it is meant a state where there is no or only very little conduction of current through the switch unit. Thus, the switch unit may be switchable so as to stop, or at least substantially stop, the switch unit from conducting current through the switch unit.

In the context of the present application, by flyback it is meant a sudden voltage spike that may be seen across an inductive load (e.g., corresponding to the inductance of one or more electrical conductors connecting the electrical energy storage module and the transformer) that has been energized when the inductive load's supply current (e.g., the discharge from the electrical energy storage module) is suddenly reduced or interrupted.

The flyback protection unit may for example comprise at least one series connection of diodes. The diodes may be referred to as free-wheeling diodes.

The voltage drop across a series connection of diodes is the sum of the voltage drop across each of the diodes in the series connection of diodes. The number of diodes in the at least one series connection of diodes may be chosen such that the voltage drop across the at least one series connection of diodes for the charging current is larger than the voltage drop across the transformer for the charging current.

In accordance with one or more embodiments of the present invention the voltage drop across or over the flyback protection unit may refer to the voltage drop, e.g., the forward voltage drop, across the series connected diodes.

The at least one series connection of diodes may for example comprise at least four diodes connected in series. The at least one series connection of diodes could possibly comprise at least five diodes connected in series, or at least six or more diodes connected in series. Possibly, the flyback protection unit may comprise at least two series connections of diodes wherein two or more of the series connections of diodes may be electrically connected in parallel.

Any one or each of the diodes which may be included in the flyback protection unit may comprise, for example, in principle any type of semiconductor diode.

Possibly, the flyback protection unit may comprise one or more Zener diodes.

The transformer may comprise at least one core.

The arrangement may comprise a transformer reset power supply, electrically connected to the transformer and configured to supply a current to the transformer for resetting the at least one core of the transformer prior to an electrical pulse generated by the at least one electrical pulse generating module being received by the transformer. The charging current directed via the transformer may contribute to the resetting of the at least one core of the transformer.

The transformer may comprise at least one reset winding arranged so as to at least in part surround the at least one core of the transformer. The transformer reset power supply may be electrically connected to the transformer by way of the at least one reset winding for supplying a current to the transformer for resetting the at least one core of the transformer.

In the context of the present application, by resetting a core of a transformer it is meant to reset the core to its appropriate magnetic operating point. This may entail removing all, or substantially all, energy from the core. Alternatively, the transformer core may not be demagnetized, but may be reset to a magnetic operating point in which the core is magnetized so as to exhibit a negative magnetic field strength. For example, if the magnetic field strength of the transformer core can vary between $-B_1$ and $B_1$, where $B_1>0$, the transformer core may be reset that it has a magnetic field strength $-B_1$. The operating range of the transformer before saturation of the transformer core may occur could then hence be $2B_1$. Resetting of a core of a transformer may in alternative be referred to as applying a bias to the core. By resetting the at least one core of the transformer after each electrical pulse, the full or a substantially full operating range of the transformer may be available for the next electrical pulse received by the transformer.

The flyback protection unit and the switch unit may for example be electrically connected in parallel.

The flyback protection unit and the transformer may for example be electrically connected in parallel.

According to one or more embodiments of the present invention, the arrangement may comprise at least one additional switch unit (i.e., in addition to the above-mentioned switch unit that is electrically connected to the power supply and the electrical energy storage module). The at least one additional switch unit may be arranged in the current path formed by the flyback protection unit. The at least one additional switch unit may be controllably switchable between at least a conducting state and a non-conducting state, and may for example comprise one or more solid-state semiconductor switching devices with turn-on and turn-off capability, such as, for example, at least one IGCT, MOS- FET, GTO and/or IGBT, but is not limited thereto. The at least one additional switch unit may for example be electrically connected in series with the flyback protection unit. The at least one additional switch unit may be operated so as to be switched into the non-conducting state thereof during the charging of the electrical energy storage module.

As mentioned above, the flyback protection unit may possibly be configured such that a relation between the voltage drop across the flyback protection unit for the charging current and the voltage drop across the transformer for the charging current is such so as to cause the charging current to be directed via the transformer, but not (or substantially not) via the current path formed by the flyback protection unit. By switching the at least one additional switch unit into the non-conducting state thereof during the charging of the electrical energy storage module by way of a charging current supplied by the power supply, it may be ensured that the charging current entirely (or substantially entirely) avoids the current path formed by the flyback protection unit.

Further objects and advantages of the present invention are described in the following by means of exemplifying embodiments. It is noted that the present invention relates to all possible combinations of features recited in the claims. Further features of, and advantages with, the present invention will become apparent when studying the appended claims and the description herein. Those skilled in the art realize that different features of the present invention can be combined to create embodiments other than those described herein.

BRIEF DESCRIPTION OF THE DRAWINGS

Exemplifying embodiments of the present invention will be described below with reference to the accompanying drawings.

All the figures are schematic, not necessarily to scale, and generally only show parts which are necessary in order to elucidate embodiments of the present invention, wherein other parts may be omitted or merely suggested.

DETAILED DESCRIPTION

The present invention will now be described hereinafter with reference to the accompanying drawings, in which exemplifying embodiments of the present invention are shown. The present invention may, however, be embodied in many different forms and should not be construed as limited to the embodiments of the present invention set forth herein; rather, these embodiments are provided by way of example so that this disclosure will convey the scope of the present invention to those skilled in the art.

Figure 1:
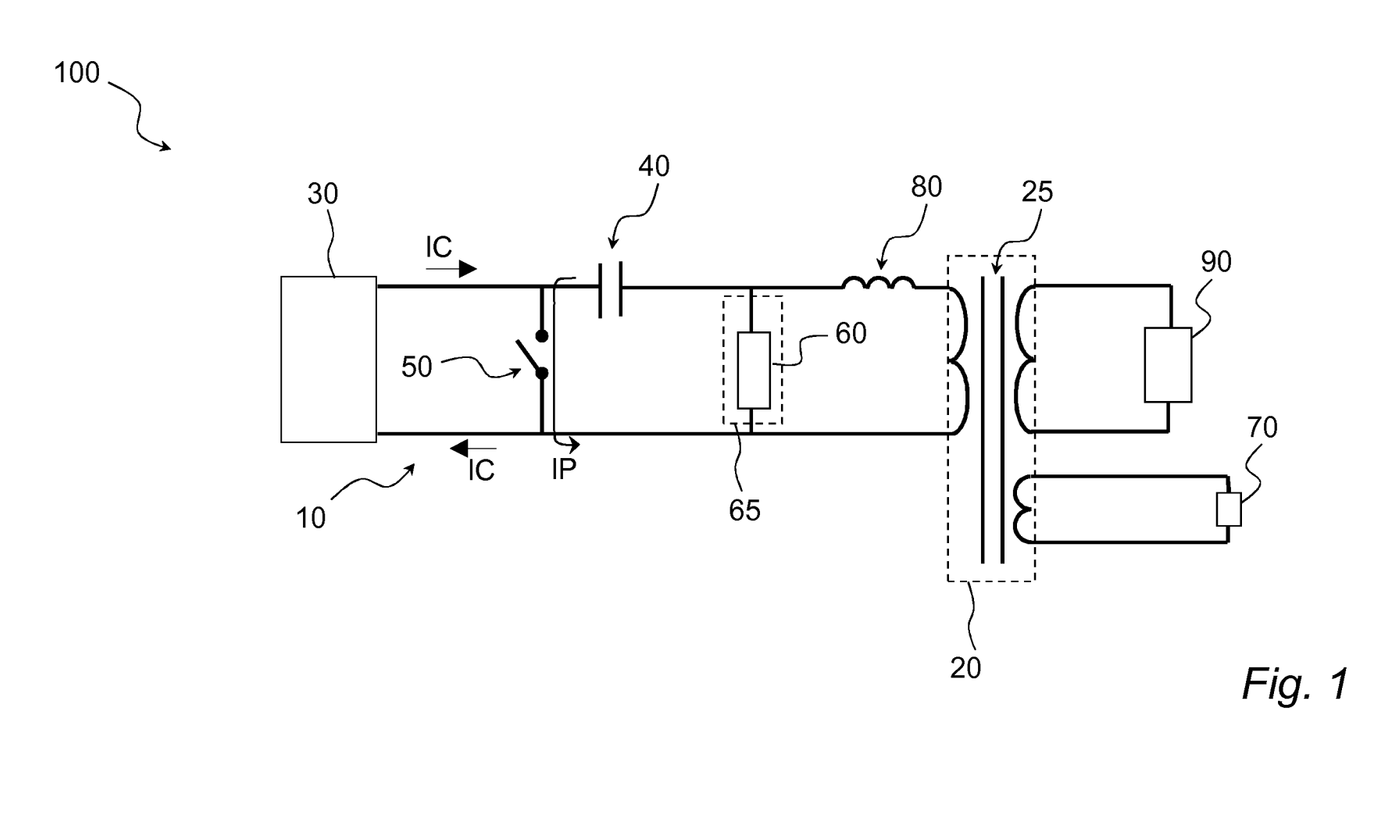
FIG. 1 is a schematic view of an arrangement according to an embodiment of the present invention.

FIG. 1 is a schematic view of an arrangement 100 according to an embodiment of the present invention. The arrangement 100 comprises an electrical pulse generating module 10 which is configured to generate at least one electrical pulse. The arrangement 100 comprises a transformer 20. The transformer 20 is electrically connected to the electrical pulse generating module 10. The transformer 20 is configured to receive one or more electrical pulses generated by the at least one electrical pulse generating module 10. Although only one electrical pulse generating module 10 is illustrated in FIG. 1, it is to be understood that the arrangement 100 may—in accordance with one or more embodiments of the present invention—comprise several electrical pulse generating modules, each of which may be electrically connected with the transformer 20.

As indicated in the foregoing, the electrical pulse generating module 10 may be configured to generate a plurality of pulses by repeatedly or cyclically performing charging and discharging of an electrical energy storage module, such as, for example, a capacitor or a capacitor bank. Each time the electrical energy storage module is discharged, an electrical pulse may be generated which may be received by the transformer 20. The transformer 20 may for example include or be constituted by a voltage step-up transformer. In accordance with the embodiment of the present invention illustrated in FIG. 1, the transformer 20 may be connected to a load 90, which hence may receive the electrical pulse via the transformer 20.

The electrical pulse generating module 10 comprises a power supply 30 and an electrical energy storage module 40 that can be charged or discharged. The power supply 30 may comprise a power converter. For example, the power supply 30 could comprise or be connectable to an AC source (not shown in FIG. 1), and could comprise a rectifier (not shown in FIG. 1) for converting AC from the AC source into DC, which may be employed to charge the electrical energy storage module 40. As illustrated in FIG. 1, the electrical energy storage module 40 is electrically connected to the transformer 20. As indicated in the foregoing and as illustrated in FIG. 1, the electrical energy storage module 40 may for example comprise a capacitor, or several capacitors, e.g., arranged in a capacitor bank. However, it is to be understood that the electrical energy storage module 40 is not limited to being capacitor-based, but it could in alternative or in addition be based on another or other types of electrical energy storage means.

The electrical pulse generating module 10 comprises a switch unit 50. The switch unit 50 is controllably switchable between at least a conducting state and a non-conducting state of the switch unit 50. The switch unit 50 could for example comprise one or more solid-state semiconductor switching devices, such as, for example, at least one IGCT, MOSFET, GTO and/or IGBT, and/or another or other types of electronic switching devices with turn-on and turn-off capability.

As illustrated in FIG. 1, the switch unit 50 is electrically connected to the power supply 30 and the electrical energy storage module 40, respectively, such that when the switch unit 50 is switched into the non-conducting state, the power supply 30 charges the electrical energy storage module 40 by way of a charging current supplied by the power supply 30 to the electrical energy storage module 40, and when the switch unit 50 is switched into the conducting state, the electrical energy storage module 40 is discharged so as to create an electrical pulse, which can be received by the transformer 20.

The transformer 20 may comprise at least one winding by which the transformer 20 may be electrically connected to the electrical pulse generating module 10. For example, the transformer 20 may be electrically connected to the electrical pulse generating module 10 by way of two terminals thereof, as illustrated in FIG. 1. In accordance with the embodiment of the present invention illustrated in FIG. 1 and as indicated therein, the transformer 20 may comprise two windings by which the transformer 20 may be electrically connected to the electrical pulse generating module. However, it is to be understood that the number of windings of the transformer 20 by which the transformer 20 may be electrically connected to the electrical pulse generating module 10 is not limited to two, but may for example be larger than two. The winding(s) of the transformer 20 may be configured to receive the electrical pulses generated by the electrical pulse generating module 10.

In accordance with the embodiment of the present invention illustrated in FIG. 1, the charging current that is supplied by the power supply 30 when the switch unit 50 is switched into the non-conducting state may flow out of the power supply 30 via the conductor of the two conductors connected to the power supply 30 that is uppermost in FIG. 1, and return to the power supply 30 via the conductor of the two conductors connected to the power supply 30 that is lowermost in FIG. 1, as indicated by the arrows IC in FIG. 1. The two above-mentioned conductors may for example be connected to two terminals of the power supply 30, as illustrated in FIG. 1.

Further in accordance with the embodiment of the present invention illustrated in FIG. 1, an electrical pulse, which is generated when the electrical energy storage module 40 is discharged upon the switch unit 50 being switched into the conducting state, may flow in the direction indicated by the arrow IP in FIG. 1. The duration of an electrical pulse may for example be 1 ms or about 1 ms, but is not limited thereto, and could be longer, or shorter.

The arrangement 100, e.g., the electrical pulse generating module 10, comprises a flyback protection unit 60. The flyback protection unit 60 is electrically connected to the switch unit 50. The flyback protection unit 60 is configured to protect the switch unit 50 against flyback, e.g., when the switch unit 50 is switched into the non-conducting state thereof.

For example, the switch unit 50 may during the delivery of an electrical pulse have been switched into the conducting state for such a period of time that an inductance 80 has been fully energized. The inductance 80 may possibly not be a separate electrical component in the electrical pulse generating module 10, but could for example be the inductance of the conductor between the flyback protection circuit 60 and the transformer 20. When the switch unit 50 is switched into the non-conducting state, the discharge from the electrical energy storage module 40 may be suddenly reduced or interrupted. This may entail that a surge of voltage, or voltage spike, is created, which in turn may cause an overvoltage condition in the switch unit 50 that may damage or even destroy the switch unit 50. The flyback protection unit 60 may protect against such an overvoltage condition in the switch unit 50 by allowing for the inductance 80 to draw current from itself in a continuous circuit until the energy in the inductance 80 has been sufficiently dissipated, e.g., by means of resistive losses in conductors in the electrical pulse generating module 10.

The flyback protection unit 60 forms a current path, schematically indicated by reference numeral 65 in FIG. 1, which bypasses the transformer 20. This may for example be implemented by means of an electrical configuration such as illustrated in FIG. 1. In accordance with the embodiment of the present invention illustrated in FIG. 1, the flyback protection unit 60 and the switch unit 50 may be electrically connected in parallel, and the flyback protection unit 60 and the transformer 20 may in addition or alternatively be electrically connected in parallel.

The flyback protection unit 60 is configured such that a relation between the voltage drop across the flyback protection unit 60 for the charging current and the voltage drop across the transformer 20 for the charging current is such so as to cause the charging current, which is supplied by the power supply 30 when the switch unit 50 is switched into the non-conducting state, to be directed via the transformer 20 at least to some extent. Thus, by means of the above-mentioned configuration of the flyback protection unit 60, at least a part or portion of the charging current is directed via the transformer 20 (and not only via the current path 65 formed by the flyback protection unit 60). The charging current, or at least a part or portion thereof, may be directed via the transformer 20 by means of the charging current or at least a part or portion thereof being conveyed through the winding(s) of the transformer 20.

The voltage drop across the flyback protection unit 60 for the charging current may determine the voltage over the transformer 20 (e.g., the voltage over at least one (primary) winding of the transformer 20), which in turn may govern the extent to which the part or portion of the charging current that is directed via the transformer 20 contributes to the resetting of the core.

Possibly, the flyback protection unit 60 may be configured such that the voltage drop across the flyback protection unit 60 for the charging current is larger than the voltage drop across the transformer 20 for the charging current, so as to cause the charging current to be directed via the transformer 20, but not (or only to a very small extent) via the current path 65 formed by the flyback protection unit 60. In other words, the charging current may possibly be caused, by the configuration of the flyback protection unit 60 relatively to the transformer 20, to altogether avoid the current path 65 formed by the flyback protection unit 60.

A configuration of the flyback protection unit 60 as described in the foregoing—i.e. such that a relation between the voltage drop across the flyback protection unit 60 for the charging current and the voltage drop across the transformer 20 for the charging current is such so as to cause the charging current to be directed via the transformer 20 at least to some extent—may be achieved in different manners. According to one example—and in accordance with one or more embodiments of the present invention—the flyback protection unit 60 may comprise several diodes arranged so as to achieve a configuration of the flyback protection unit 60 such that a relation between the voltage drop across the flyback protection unit 60 for the charging current and the voltage drop across the transformer 20 for the charging current is such so as to cause at least a part or portion of the charging current to be directed via the transformer 20.

Figure 2:
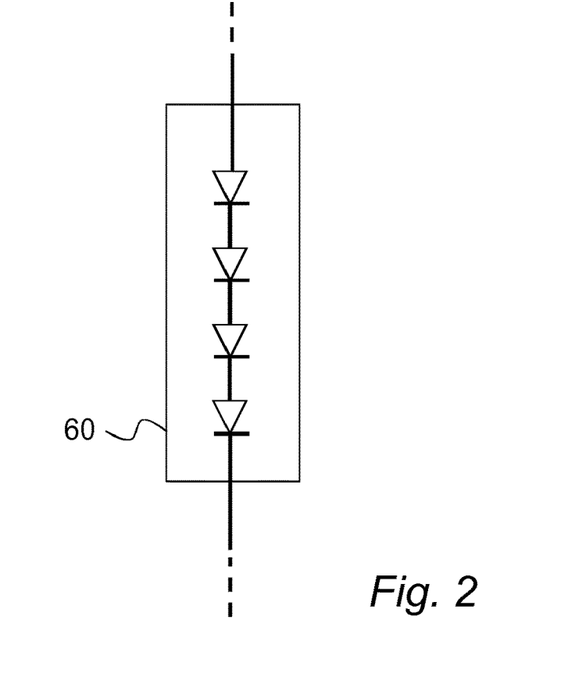
FIGS. 2 and 3 are schematic views of flyback protection units in accordance with different embodiments of the present invention.
Figure 3:
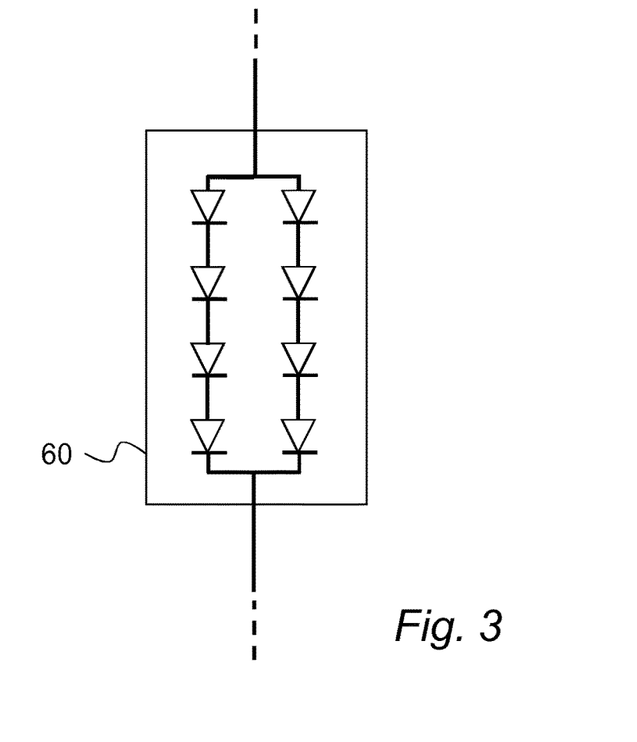

FIGS. 2 and 3 are schematic views of flyback protection units 60 in accordance with different embodiments of the present invention. The upper and lower conductors (of which only parts are shown) extending into the flyback protection unit 60 illustrated in the respective ones of FIGS. 2 and 3 correspond to the upper and lower conductors, respectively, extending into the flyback protection unit 60 illustrated in FIG. 1.

As illustrated in FIG. 2, the flyback protection unit 60 may, in accordance with an embodiment of the present invention, comprise a series connection of diodes. The number of diodes in the series connection of diodes may possibly be chosen such that the voltage drop across the series connection of diodes (or flyback protection unit 60) for the charging current is larger than the voltage drop across the transformer 20 for the charging current. The number of diodes in the series connection of diodes may for example be four, in accordance with the embodiment of the present invention illustrated in FIG. 2, but it may for example be larger than four, such as, for example, five, six, seven or an even larger number.

According to one or more embodiments of the present invention, the flyback protection unit 60 may comprise at least two series connections of diodes electrically connected in parallel, for example for the purpose of redundancy. This is illustrated in FIG. 3, wherein the flyback protection unit 60 comprises two series connections of diodes, each including four diodes, with the two series connections of diodes electrically connected in parallel.

With further reference to FIG. 1, the flyback protection unit 60 may, depending on the voltage drop across the transformer 20 for the charging current, have to be configured so as to exhibit a larger voltage drop across the flyback protection unit 60 (for the charging current) than what might be sufficient for achieving a sufficient flyback protection functionality or capacity for the switch unit 50. For example, with further reference to FIGS. 2 and 3, the number of diodes in the series connection of diodes may be chosen to be larger than a number of diodes which might be sufficient for achieving a sufficient flyback protection functionality or capacity for the switch unit 50.

The arrangement 100 comprises a transformer reset power supply 70. The transformer reset power supply 70 is electrically connected to the transformer 20. As indicated in FIG. 1, the transformer reset power supply 70 may be electrically connected to the transformer 20 by means of two reset windings, which may be arranged so as to at least in part surround the core 25 of the transformer 20. However, it is to be understood that the number of reset windings illustrated in FIG. 1 is according to an example, and that the transformer 20 could possibly comprise more than two reset windings, or even a single reset winding only, for electrically connecting the transformer reset power supply 70 with the transformer 20. The reset windings may for example be wound outside other windings of the transformer 20, and the reset windings may be electrically insulated from the other windings.

The transformer reset power supply 70 is configured to supply a current to the transformer 20 for resetting the core 25 of the transformer 20 prior to that an electrical pulse generated by the electrical pulse generating module 10 is received by the transformer 20.

By the above-mentioned configuration of the flyback protection unit 60, at least a part or portion of the charging current is directed via the transformer 20 (and not only via the current path 65 formed by the flyback protection unit 60). The (part of portion of) charging current directed via the transformer 20 may hence contribute to the resetting of the core 25 of the transformer 20.

The supplying of a current by the transformer reset power supply 70 to the transformer 20 may be controlled so as to begin the supplying of the current upon the termination of an electrical pulse and ending the supplying of the current when the next electrical pulse is to be delivered. To that end, the arrangement 100 may comprise a control and/or processing unit (not shown in FIG. 1) configured to control the supplying of a current by the transformer reset power supply 70 to the transformer 20. The control and/or processing unit may be communicatively coupled or connected with the electrical pulse generating module 10 and the transformer reset power supply 70, respectively (and/or with another or other components of the arrangement 100), employing for example any appropriate wired and/or wireless communication technique or means known in the art. The control and/or processing unit may for example include or be constituted by any suitable central processing unit (CPU), microcontroller, digital signal processor (DSP), Application Specific Integrated Circuit (ASIC), Field Programmable Gate Array (FPGA), etc., or any combination thereof. The control and/or processing unit may optionally be capable of executing software instructions stored in a computer program product e.g. in the form of a memory. The memory may for example be any combination of read and write memory (RAM) and read only memory (ROM). The memory may comprise persistent storage, which for example can be a magnetic memory, an optical memory, a solid state memory or a remotely mounted memory, or any combination thereof.

The control and/or processing unit may, in alternative or in addition, be configured to control operation of other components of the arrangement 100, e.g., components of the electrical pulse generating module 10, such as for example, the switch unit 50. For example, the control and/or processing unit could be configured to control operation of the switch unit 50 with respect to switching the switch unit 50 between the conducting state and the non-conducting state of the switch unit 50.

Figure 4:
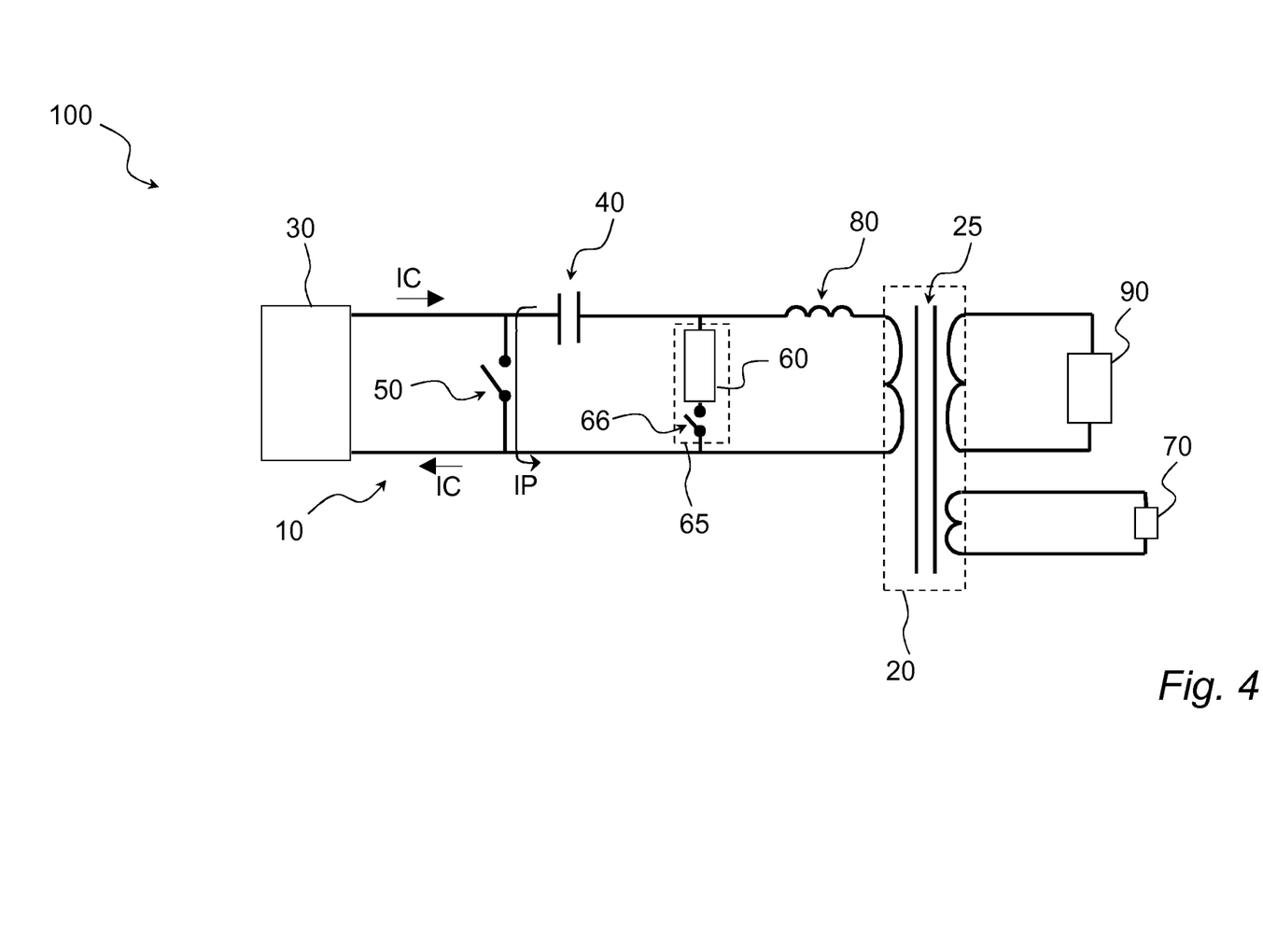
FIG. 4 is a schematic view of an arrangement according to an embodiment of the present invention.

FIG. 4 is a schematic view of an arrangement 100 according to an embodiment of the present invention. The arrangement 100 illustrated in FIG. 4 is similar to the arrangement 100 illustrated in FIG. 1, and the same reference numerals in FIGS. 1 and 3 indicate the same or similar components, having the same or similar function.

The arrangement 100 illustrated in FIG. 4 differs from the arrangement 100 illustrated in FIG. 1 in that the arrangement 100 illustrated in FIG. 4 comprises an additional switch unit 66, which in accordance with the illustrated embodiment of the present invention is arranged in the current path 65 and is electrically connected in series with the flyback protection unit 60. The switch unit 66 may be controllably switchable between at least a conducting state and a non-conducting state, and may for example comprise one or more solid-state semiconductor switching devices with turn-on and turn-off capability, such as, for example, at least one IGCT, MOSFET, GTO and/or IGBT.

As mentioned in the foregoing with reference to FIG. 1, the flyback protection unit 60 may possibly be configured such that a relation between the voltage drop across the flyback protection unit 60 for the charging current and the voltage drop across the transformer 20 for the charging current is such so as to cause the charging current to be directed via the transformer 20, but not (or substantially not) via the current path 65. By switching the switch unit 66 into the non-conducting state thereof during the charging of the electrical energy storage module 40 by way of a charging current supplied by the power supply 30, it may be ensured that the charging current entirely (or substantially entirely) avoids the current path 65 (and instead is directed via the transformer 20).

According to another aspect there is provided an arrangement comprising an electrical pulse generating module configured to generate at least one electrical pulse, and a transformer electrically connected to the electrical pulse generating module and configured to receive the at least one electrical pulse generated by the at least one electrical pulse generating module. The electrical pulse generating module comprises a power supply and an electrical energy storage module that can be charged or discharged. The electrical energy storage module is electrically connected to the transformer. The electrical pulse generating module comprises a switch unit that is controllably switchable between at least a conducting state and a non-conducting state. The switch unit is electrically connected to the power supply and the electrical energy storage module, respectively, such that the power supply charges the electrical energy storage module (partially or completely) by way of a charging current supplied by the power supply, or the electrical energy storage module is discharged (partially or completely) so as to create an electrical pulse to be received by the transformer, based on switching of the at least one switch unit between at least the conducting state and the non-conducting state thereof. For example, as per the first aspect described in the foregoing, the switch unit may be electrically connected to the power supply and the electrical energy storage module, respectively, such that when the switch unit is switched into the non-conducting state, the power supply charges the electrical energy storage module by way of a charging current supplied by the power supply, and when the switch unit is switched into the conducting state, the electrical energy storage module is discharged so as to create an electrical pulse to be received by the transformer. The arrangement comprises a flyback protection unit electrically connected to the switch unit and configured to protect the switch unit against flyback upon the switch unit being switched into the non-conducting state. The flyback protection unit is configured such that a relation between the voltage drop across the flyback protection unit for the charging current and the voltage drop across the transformer for the charging current is such so as to cause the charging current to be directed (or conveyed, or routed) via the transformer at least to some extent.

In conclusion, an arrangement is disclosed, comprising an electrical pulse generating module configured to generate at least one electrical pulse, and a transformer electrically connected to the electrical pulse generating module. The electrical pulse generating module comprises an electrical energy storage module that can be charged or discharged, and a switch unit controllably switchable between at least a conducting state and a non-conducting state. Based on switching of the at least one switch unit between at least the conducting state and the non-conducting state thereof, the power supply charges the electrical energy storage module (partially or completely) by way of a charging current supplied by the power supply or the electrical energy storage module is discharged (partially or completely) so as to create an electrical pulse to be received by the transformer. For example, when the switch unit is switched into the non-conducting state, a power supply charges the electrical energy storage module by way of a charging current, and when the switch unit is switched into the conducting state, the electrical energy storage module is discharged to create an electrical pulse to be received by the transformer. The electrical pulse generating module comprises a flyback protection unit configured to protect the switch unit against flyback upon the switch unit being switched into the non-conducting state. The flyback protection unit forms a current path that bypasses the transformer, and is configured such that a relation between the voltage drop across the flyback protection unit for the charging current and the voltage drop across the transformer for the charging current is such to cause the charging current to be directed via the transformer at least to some extent.

While the present invention has been illustrated in the appended drawings and the foregoing description, such illustration is to be considered illustrative or exemplifying and not restrictive; the present invention is not limited to the disclosed embodiments. Other variations to the disclosed embodiments can be understood and effected by those skilled in the art in practicing the claimed invention, from a study of the drawings, the disclosure, and the appended claims. In the appended claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. An arrangement comprising:
   an electrical pulse generating module configured to generate at least one electrical pulse; and
   a transformer electrically connected to the electrical pulse generating module and configured to receive the at least one electrical pulse generated by the electrical pulse generating module;
   the electrical pulse generating module comprising:
   a power supply;
   an electrical energy storage module capable of being charged or discharged, the electrical energy storage module being electrically connected to the transformer;
   a switch unit controllably switchable between at least a conducting state and a non-conducting state, wherein the switch unit is electrically connected to the power supply and the electrical energy storage module, respectively, such that the power supply charges the electrical energy storage module by way of a charging current supplied by the power supply, or the electrical energy storage module is discharged so as to create an electrical pulse to be received by the transformer, based on switching of the switch unit between at least the conducting state and the non-conducting state thereof; and
   a flyback protection unit electrically connected to the switch unit and configured to protect the switch unit against flyback upon the switch unit being switched into the non-conducting state;
   wherein the flyback protection unit forms a current path that bypasses the transformer, and wherein the flyback protection unit is configured such that a relation between the voltage drop across the flyback protection unit for the charging current and the voltage drop across the transformer for the charging current is such so as to cause at least a part of the charging current to be directed via the transformer; and
   wherein the flyback protection unit comprises at least one series connection of diodes, and wherein the number of diodes in the at least one series connection of diodes is chosen such that the voltage drop across the at least one series connection of diodes for the charging current is larger than the voltage drop across the transformer for the charging current.

2. The arrangement according to claim 1, wherein the at least one series connection of diodes comprises at least four diodes electrically connected in series.

3. The arrangement according to claim 1, wherein the flyback protection unit comprises at least two series connections of diodes electrically connected in parallel.

4. The arrangement according to claim 1, wherein the flyback protection unit is configured such that a relation between the voltage drop across the flyback protection unit for the charging current and the voltage drop across the transformer for the charging current is such so as to cause the charging current to be directed via the transformer but not via the current path formed by the flyback protection unit.

5. The arrangement according to claim 1, further comprising at least one additional switch unit arranged in the current path formed by the flyback protection unit, the at least one additional switch unit being controllably switchable between at least a conducting state and a non-conducting state.

6. The arrangement according to claim 1, wherein the transformer comprises at least one core, and wherein the arrangement further comprises a transformer reset power supply electrically connected to the transformer and configured to supply a current to the transformer for resetting the at least one core of the transformer prior to the at least one electrical pulse generated by the electrical pulse generating module being received by the transformer, wherein the charging current directed via the transformer contributes to the resetting of the at least one core of the transformer.

7. The arrangement according to claim 1, wherein the flyback protection unit and the switch unit are electrically connected in parallel.

8. The arrangement according to claim 1, wherein the flyback protection unit and the transformer are electrically connected in parallel.

* * * * *